(12) United States Patent
Buonpane et al.

(10) Patent No.: US 7,786,814 B2
(45) Date of Patent: Aug. 31, 2010

(54) METHOD AND APPARATUS FOR DERIVING AN INTEGRATED CIRCUIT (IC) CLOCK WITH A FREQUENCY OFFSET FROM AN IC SYSTEM CLOCK

(75) Inventors: Michael S. Buonpane, Easton, PA (US);
James D. Chlipala, Emmaus, PA (US);
Richard P. Martin, Macungie, PA (US);
Scott A. Segan, Allentown, PA (US);
Zhongke Wang, Bridgewater, NJ (US)

(73) Assignee: Agere Systems Inc., Allentown, PA (US)

( * ) Notice: Subject to any disclaimer, the term of this patent is extended or adjusted under 35 U.S.C. 154(b) by 51 days.

(21) Appl. No.: 12/199,881

(22) Filed: Aug. 28, 2008

(65) Prior Publication Data
US 2010/0052800 A1     Mar. 4, 2010

(51) Int. Cl.
*H03B 5/24*     (2006.01)
(52) U.S. Cl. .......................................... 331/57; 331/44

(58) Field of Classification Search ................ 331/57, 331/44
See application file for complete search history.

(56) References Cited

U.S. PATENT DOCUMENTS 5,237,290 A * 8/1993 Banu et al. ................... 331/2
6,259,326 B1 * 7/2001 Dunlop et al. ............... 331/2

* cited by examiner

*Primary Examiner*—Joseph Chang
(74) *Attorney, Agent, or Firm*—Ryan, Mason & Lewis, LLP

(57) ABSTRACT

Generally, methods and apparatus are provided for deriving an integrated circuit (IC) clock signal with a frequency that is offset from the IC system clock. An offset clock having a frequency that is offset from a system clock is generated by configuring a ring oscillator in a first mode to generate the system clock having a desired frequency; and adjusting the configuration of the ring oscillator in a second mode to generate the offset clock having the frequency that is offset from the system clock. The configuration of the ring oscillator is adjusted in the second mode by adjusting (i) a power supply value applied to the ring oscillator in the second mode relative to a power supply value applied in the first mode; or (ii) a number of delay line elements that are active in the ring oscillator loop.

19 Claims, 3 Drawing Sheets

- 305 — PRESERVE $B_X$ VALUES WITH ONE AND ONLY ONE BEING EQUAL TO LOGIC 1
- 310 — EVERY TRI-STATABLE BUFFER IS IN HIGH IMPEDANCE, NON-DRIVING STATE EXCEPT 150-i
- 315 — BUFFER 150-i IS DRIVING A LOGIC 1 ON "1" INPUT OF MULTIPLEXER 175
- 320 — ASSERT RING_OSC (CHANGE TO LOGIC 1)
- 325 — "1" INPUT OF MULTIPLEXER 175 IS SELECTED
- 330 — LOGIC 1 IS PLACED ON INPUT OF NAND GATE 180
- 335 — OUTPUT OF NAND GATE 180 GOES TO LOGIC 0
- 340 — THIS LOGIC 0 TRAVELS DOWN DELAY LINE 140
- 345 — WHEN LOGIC 0 ENCOUNTERS INPUT TO BUFFER 150-i, BUFFER 150-i FORCES "1" INPUT OF MULTIPLEXER 175 TO LOGIC 0
- 350 — A LOGIC 0 IS PLACED ON INPUT OF NAND GATE 180
- 355 — OUTPUT OF NAND GATE 180 GOES TO LOGIC 1
- 360 — THIS LOGIC 1 TRAVELS DOWN DELAY LINE 140
- 365 — WHEN LOGIC 1 ENCOUNTERS INPUT TO BUFFER 150-i, BUFFER 150-i FORCES "1" INPUT OF MULTIPLEXER 175 TO LOGIC 1
- 370 — A LOGIC 1 IS PLACED ON INPUT OF NAND GATE 180
- 380 — (AT THIS POINT, ONE COMPLETE PERIOD OF RING OSCILLATOR HAS ELAPSED)
- 385 — RING OSCILLATOR CONSISTS OF A CIRCUIT LOOP BEGINNING AT INPUT TO MULTIPLEXER 175, CONTINUING THROUGH NAND GATE 180, CONTINUING THROUGH A NUMBER OF DLEs 140, CONTINUING THROUGH BUFFER 150-i, AND BACK TO INPUT OF MULTIPLEXER 175
- 390 — A SYSTEM CLOCK OUTPUT CAN BE OBTAINED FROM ANY NODE IN ABOVE DESCRIBED RING
- 394 — INSPECTION OF RING REVEALS AN ODD NUMBER OF INVERSIONS (i.e., 1 INVERSION FROM NAND) AS REQUIRED FOR A RING OSCILLATOR
- 396 — ASSUMING APPROXIMATE EQUALITY FOR PROPAGATION DELAYS THROUGH FLIP-FLOP 170 AS COMPARED TO PROPAGATION DELAY THROUGH BUFFER 150-i, ONE CYCLE AROUND LOOP SHOULD APPROXIMATE ½ PERIOD OF SYSCLK AND TWO CYCLES AROUND LOOP SHOULD APPROXIMATE 1 PERIOD OF SYSCLK
- 398 — ASSERT SYSCLK_SELECT (i.e., CHANGE TO LOGIC 1) AND MULTIPLEXER 185 NOW PRESENTS "TURBO OR DOWNSHIFT CLOCK" AS SYSTEM CLOCK (i.e., SYSCLK)

METHOD AND APPARATUS FOR DERIVING AN INTEGRATED CIRCUIT (IC) CLOCK WITH A FREQUENCY OFFSET FROM AN IC SYSTEM CLOCK

FIELD OF THE INVENTION

The present invention relates generally to clock generation techniques, and more particularly, to techniques for generating an offset clock having a frequency that is offset from a system clock.

BACKGROUND OF THE INVENTION

In some integrated circuit (IC) applications it is desirable to have a mode in which the system clock frequency can be increased by a predefined amount on a temporary basis and then allowed to return to the original frequency (this mode is referred to herein as a Turbo Mode). For example, a switching system might experience a temporary increase in usage such that the overall performance of the communication network would be negatively impacted. If the IC could temporarily increase the frequency of its system clock, the network performance degradation might be avoided.

Conversely, in some applications it may be desirable to have a mode in which the system clock frequency can be decreased by a predefined amount on a temporary basis and then allowed to return to the original frequency (this mode is referred to herein as a Downshift Mode). For example, in the switching system described above, the traffic level might decrease to a point where a decrease in system clock frequency would reduce power consumption but still support the communication traffic.

A need therefore exists for methods and apparatus for deriving an integrated circuit clock signal with a frequency that is offset from the system clock

SUMMARY OF THE INVENTION

Generally, methods and apparatus are provided for deriving an integrated circuit (IC) clock signal with a frequency that is offset from the IC system clock. According to one aspect of the invention, an offset clock having a frequency that is offset from a system clock is generated by configuring a ring oscillator in a first mode to generate the system clock having a desired frequency; and adjusting the configuration of the ring oscillator in a second mode to generate the offset clock having the frequency that is offset from the system clock.

In one embodiment, the configuration of the ring oscillator is adjusted in the second mode by adjusting a power supply value applied to the ring oscillator in the second mode relative to a power supply value applied in the first mode. In another embodiment, the configuration of the ring oscillator is adjusted in the second mode by adjusting a number of delay line elements that are active in the ring oscillator loop (e.g., having an output that is a first predefined logic value in the second mode relative to a number of delay line elements in the ring oscillator having the output that is the first predefined logic value in the first mode).

The first and second modes can be distinguished by number of delay line elements in the ring oscillator having an output that is a first predefined logic value. The number of delay line elements can be identified, for example, by applying an output of the delay line elements to one or more XOR gates. The number of delay line elements having the output that is the first predefined logic value provides an indication of a half period of the system clock. The output of the ring oscillator can be a final one of the delay line elements having the output that is the first predefined logic value provides or another node in the ring.

A more complete understanding of the present invention, as well as further features and advantages of the present invention, will be obtained by reference to the following detailed description and drawings.

BRIEF DESCRIPTION OF THE DRAWINGS

FIG. 3 illustrates exemplary pseudo code for an operational sequence.

DETAILED DESCRIPTION

The present invention provides methods and apparatus for deriving an integrated circuit clock signal with a frequency that is offset from the system clock. According to one aspect of the invention, the generated clock has a frequency with a known and typically small difference relative to the system clock. According to another aspect of the invention, a ring oscillator is calibrated to the system clock with a frequency that is similar to, but different from, the frequency of the system clock. In one exemplary embodiment, the disclosed circuit provides one or more of a Turbo Mode and a Downshift Mode of operation. In a Turbo Mode, the disclosed circuit generates a clock that is faster than the system clock. In a Downshift Mode, the disclosed circuit generates a clock that is slower than the system clock.

In one exemplary embodiment, the Turbo Mode is achieved by temporarily increasing the power supply value, causing the circuitry to "speed up" (i.e., exhibit faster speeds of operation). Thus, if the power supply of the disclosed circuit were to be increased over that used during calibration, then the frequency of oscillation would increase with respect to the frequency exhibited with the original power supply value. When the system desires to return to a normal operating mode, the power supply is reduced back to the original value. In a further variation, the Turbo Mode is achieved by temporarily reducing the number of delay elements that are operable in the ring oscillator loop, relative to the number of delay elements that were operable in the ring oscillator loop during calibration.

In one exemplary embodiment, the Downshift Mode is achieved by temporarily decreasing the power supply value, causing the circuitry to "slow down" (i.e., exhibit slower speeds of operation). Thus, if the power supply of the disclosed circuit were to be decreased relative to that used during calibration, then the frequency of oscillation would decrease with respect to the frequency exhibited with the original power supply value. When the system desires to return to a normal operating mode, the power supply is increased back to the original value. In a further variation, the Downshift Mode is achieved by temporarily increasing the number of delay elements that are operable in the ring oscillator loop, relative to the number of delay elements that were operable in the ring oscillator loop during calibration.

Figure 1:
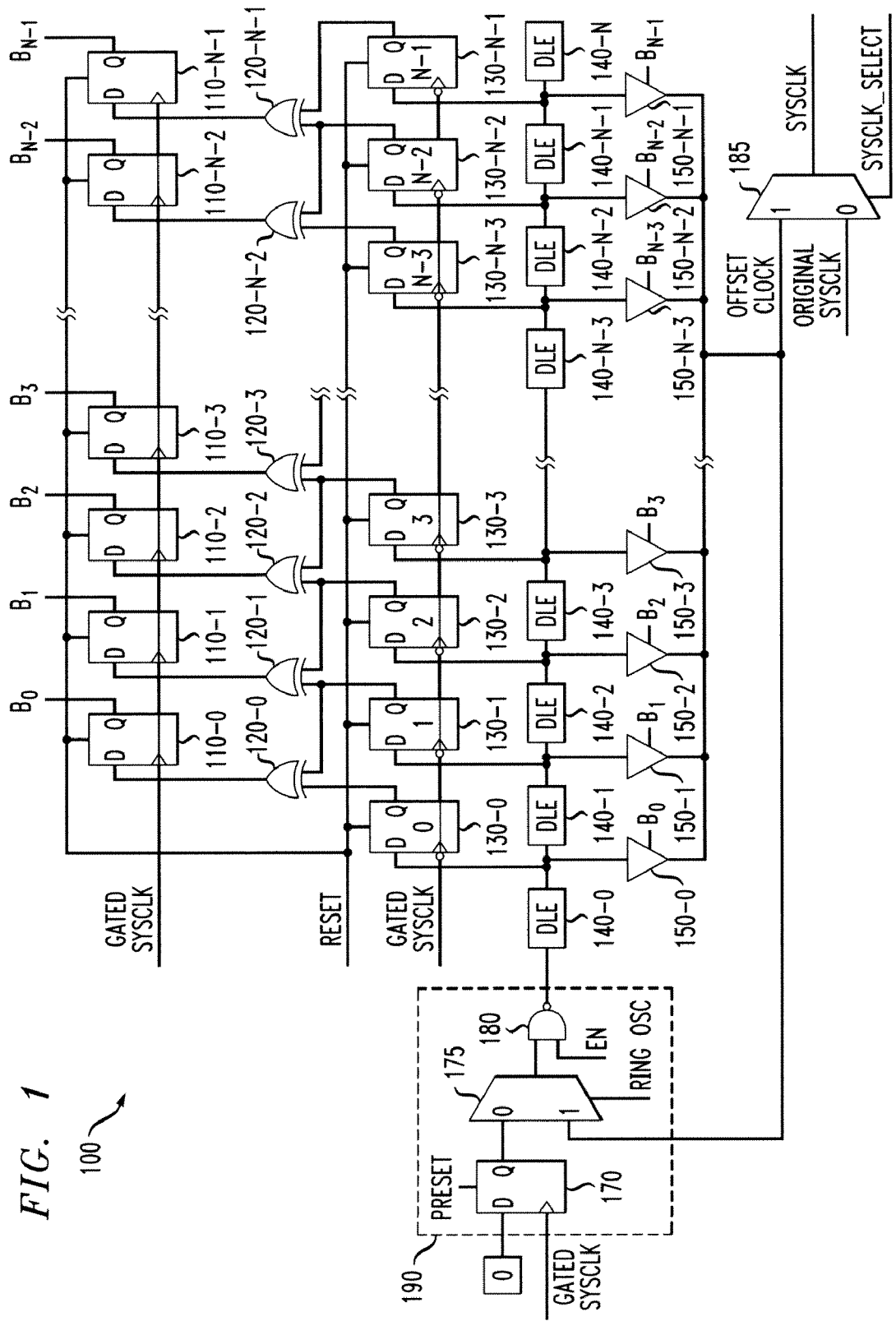
FIG. 1 is a schematic block diagram of a ring oscillator circuit in accordance with the present invention.

FIG. 1 is a schematic block diagram of a ring oscillator circuit 100 in accordance with the present invention. As previously indicated, the disclosed ring oscillator circuit 100 generates a clock having a frequency that is offset relative to the system clock (SYSCLK). As shown in FIG. 1, the ring oscillator circuit 100 comprises a chain of delay line elements (DLEs) 140-0 through 140-N (hereinafter, collectively referred to as DLEs 140) connected in series. The propagation delay through a DLE 140 is dependent on the processing experienced by the silicon, the supply voltage, and the temperature (PVT), in a known manner. The number of DLEs 140 that are active in the ring oscillator is determined by a plurality of tri-state buffers 150-0 through 150-N−1 (hereinafter, collectively referred to as tri-state buffers 150). In particular, the output of the DLE 140 corresponding to the selected tri-state buffer 150 is the clock signal that will pass through to the output of the ring oscillator. The ring is completed by a multiplexer 175 and a NAND gate 180, discussed further below, assuming appropriate values for the enable signal, EN, and the control signal, RING_OSC, as discussed below.

A particular tri-state buffer 150 is selected based on a selection signal, B. As shown in FIG. 1, the selection signal, B, is generated based on the output of the DLEs 140, using a first set of flip-flops 130-0 through 130-N−1, a set of exclusive OR (XOR) gates 120-0 through 120-N−1, and a second set of flip-flops 110-0 through 110-N−1. The operation of the flip-flops 130, exclusive OR gates 120 and flip-flops 110 is discussed further below.

The output of the ring oscillator is applied to one input of a multiplexer 185. In addition, the original system clock (SYSCLK) is applied to a second input of the multiplexer 185. In this manner, a control signal, SYSCLK_select, determines whether an Offset Clock or the original SYSCLK is the output of the ring oscillator circuit 100.

The operation of a calibration circuit 190 is discussed further below. The exemplary calibration circuit 190 comprises a flip-flop 170, a multiplexer 175 and a NAND gate 180.

The Gated SYSCLK that is applied to the flip-flops 110, 130, 170 is a gated version of the original system clock SYSCLK.

Calibration Sequence

Figure 2:
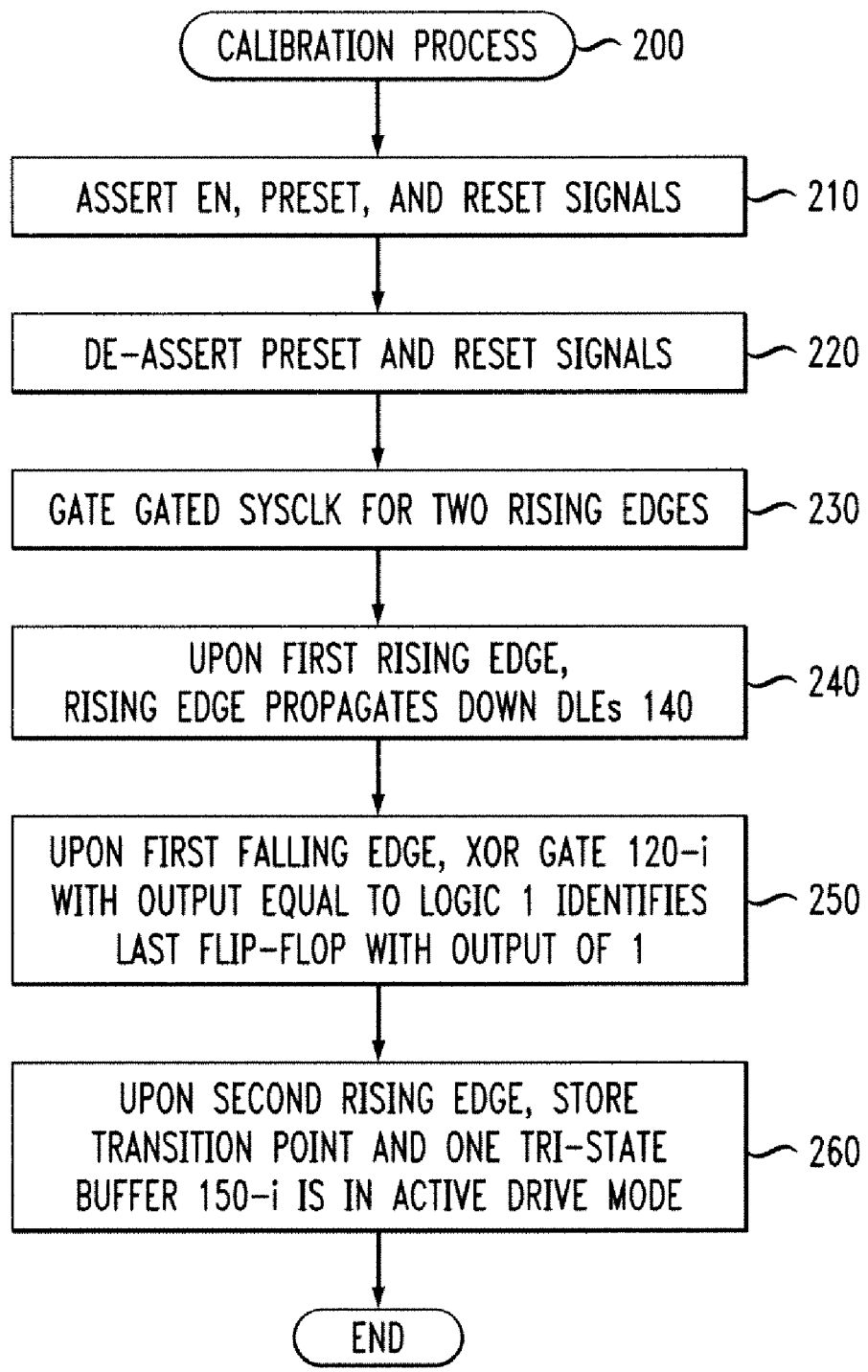
FIG. 2 is a flow chart describing an exemplary implementation of a calibration process incorporating features of the present invention.

FIG. 2 is a flow chart describing an exemplary implementation of a calibration process 200.

1. Initially, the EN, PRESET, and RESET signals are asserted (e.g., by applying a logic 1) during step 210. The multiplexer control signals, RING_OSC and SYSCLK_Select, are de-asserted (logic 0) to select the corresponding 0 input. In addition, the Gated SYSCLK is not gated (i.e., not active, no transitions).

a. The calibration flip-flop 170 having its D input connected to logic 0 and Q output connected to the "0" input of the multiplexer 175 has its Q output equal to logic 1.

b. All other flip-flops 110, 130 have Q outputs equal to logic 0.

c. Outputs of all XOR gates 120 are logic 0 (since all flip-flops 130 have a 0 output).

d. All tri-state buffers 150 are in a high impedance output (non-driving) mode (since flip-flops 110 have a 0 output for the B signals).

e. The two inputs to the NAND gate 180 are logic 1 so the output of the NAND gate 180 is logic 0.

f. The outputs of all DLEs 140 are logic 0 (since the NAND gate 180 has a 0 output).

g. With the SYSCLK_Select signal de-asserted, the multiplexer 185 is presenting the Original SYSCLK at its output as the current SYSCLK.

2. The PRESET and RESET signals are then de-asserted during step 220.

3. The Gated SYSCLK is now gated during step 230 for two rising edges and returned to a not gated state before the second falling edge of SYSCLK.

4. First rising edge of Gated SYSCLK (step 240):

a. All flip flops 110, having outputs labeled $B_0 \ldots B_{N-1}$, latch the logic 0 outputs of the XORs 120 (i.e., no change in outputs $B_0 \ldots B_{N-1}$).

b. A logic 0 is latched to the Q output of flip-flop 170.

c. The logic 0 propagates through the "0" input of multiplexer 175 onto one input of NAND gate 180.

d. The output of NAND gate 180 goes to a logic 1 (since the inputs are a logic 0 and a logic 1).

e. The logic 0 to 1 transition (i.e., a rising edge) at the output of NAND gate 180 propagates down the delay line of series connected DLEs 140.

f. Before the elapse of sufficient time to propagate down the entire delay line, the outputs of a set of DLEs 140 starting with the DLEs 140 nearest to the NAND gate 180 will have outputs of logic 1. The outputs of all remaining DLEs 140 to the right of this set will still be logic 0.

5. First falling edge of Gated SYSCLK (step 250):

a. All flip-flops 130 with D inputs connected to outputs of DLEs 140 will be clocked.

b. Those flip-flops 130-left with D inputs connected to outputs of DLEs 140 that have already gone to logic 1 will transition to Q output equal to logic 1.

c. Those flip-flops 130-right with D inputs connected to outputs of DLEs 140 that still remain at logic 0 will continue with Q output equal to logic 0.

d. A register consisting of all flip-flops 130 with D inputs connected to DLE outputs will behave like a so-called "thermometer register." In other words, there will be a flip-flop 130-$i$ such that its Q output and the Q outputs of all flip-flops 130 to its left (collectively, 130-left) will be equal to logic 1. The Q outputs of all flip-flops 130 to the right of this flip-flop 130-$i$ (collectively, 130-right) will equal logic 0.

e. After a sufficient XOR propagation delay, the output of one and only one XOR gate 120-$i$ will change to logic 1.

f. The XOR gate 120-$i$ with output equal to logic 1 identifies the particular flip-flop 140-$i$ which sets the value of the "thermometer register" (i.e., the last flip-flop with Q output equal to logic 1).

g. The propagation delay time from the D input of flip-flop 170 through the multiplexer 175, NAND gate 180, and the delay chain 140 up to the D input of flip-flop 130-$i$ now represents a good approximation to ½ period of the SYSCLK (one round trip of a rising edge through the ring, since one round trip of a rising edge through the ring plus one round trip of a falling edge through the ring corresponds to one period).

6. Second rising edge of Gated SYSCLK (step 260):

a. The outputs of the XOR gates 120 are latched into flip-flops 110 having Q outputs labeled $B_0 \ldots B_{N-1}$.

b. Before the second falling edge of Gated SYSCLK, the gating for Gated SYSCLK is removed (since the gated flip-flops 110 should not be clocked again, in order to retain the desired B values).

c. The identity of the "thermometer register" transition point, i.e., ½ SYSCLK period, is now stored in the flip-flops 110.

d. One tri-state buffer 150-$i$ corresponding to the transition point (and having its control signal, B, at logic 1) is put into active drive mode.

e. The output of the tri-state buffer 150-$i$ now forces the "1" input to the multiplexer 175 to a logic 1. The "0" input to the multiplexer 175 continues to be selected so this transition has no immediate effect on the delay line.

Calibration Sequence Example
1. Assume that at the time of the first Gated SYSCLK falling edge, the outputs of the first 3 DLEs 140-0 through 140-2 on the left of the delay line 140 are at logic 1. Further assume that the outputs of all other DLEs 140-3 through 140-N are at logic 0.
2. Thus, after the second Gated SYSCLK rising edge, $B_2$ equals 1 and all other $B_X$ values equal 0, where X equals 0, 1, 3, 4, ..., N-2, N-1. Thus, tri-state buffer 150-2 corresponding to the transition point (and having its control signal, $B_2$, at logic 1) is put into active drive mode.

Basic Ring Oscillator Operation Sequence

Once the calibration sequence 200 is complete, the identity of the "thermometer register" transition DLE is known (i.e., a good approximation to the ½ period of SYSCLK is known). At this time, the circuit 100 can be configured to operate as a ring oscillator with frequency close to that of the system clock, SYSCLK. After the calibration sequence 200 completes, an operational sequence 300, shown in FIG. 3 is initiated. FIG. 3 illustrates exemplary pseudo code for the operational sequence 300.

1. The $B_X$ values are preserved with one and only one being equal to logic 1 (step 305).
2. Every tri-state buffer 150 is in the high impedance, non-driving state except one 150-i (step 310).
3. This tri-state buffer 150-i is driving a logic 1 on the "1" input of the multiplexer 175 (step 315).
4. Assert RING_OSC control signal (i.e., change to logic 1) (step 320).
5. The "1" input of the multiplexer 175 is selected (step 325).
6. A logic 1 is placed on the input of the NAND gate 180 (step 330).
7. The output of the NAND gate 180 goes to logic 0 (step 335).
8. This logic 0 value travels down the delay line 140 (step 340).
9. When the logic 0 encounters the input to tri-state buffer 150-i that is in drive mode, the buffer 150-i forces the "1" input of the multiplexer 175 to logic 0 (step 345).
10. A logic 0 is placed on the input of the NAND gate 180 (step 350).
11. The output of the NAND gate 180 goes to logic 1 (step 355).
12. This logic 1 travels down the delay line 140 (step 360).
13. When the logic 1 encounters the input to tri-state buffer 150-i that is in drive mode, the buffer 150-i forces the "1" input of the multiplexer 175 to logic 1 (step 365).
14. A logic 1 is placed on the input of the NAND gate 180 (step 370).
15. At this point, one complete period of the ring oscillator has elapsed (step 380).
16. The ring oscillator consists of a circuit loop beginning at the input of multiplexer 175, continuing through the NAND gate 180, through a number of DLEs 140, through the tri-state buffer 150-i in drive mode, and back to the input of multiplexer 175 (step 385).
17. A System Clock output can be obtained from any node in the above described ring. A natural "tap" point would seem to be the output of the tri-state buffer 150-i though any other point in the ring oscillator loop could be made to function (step 390).
18. Inspection of the ring reveals an odd number of inversions (i.e., 1 inversion from the NAND gate) as required for a ring oscillator (step 394).
19. Assuming approximate equality for propagation delays through the flip-flop 170 as compared to the propagation delay through the tri-state buffer 150-i in drive mode, one cycle around the loop should approximate ½ period of the SYSCLK. Two cycles around the loop should approximate 1 period of the SYSCLK (step 396).
20. Assert the SYSCLK_Select control signal (i.e., change to logic 1). The multiplexer 185 now presents the "Offset Clock" as the System Clock (SYSCLK) (step 398).

Turbo Mode Application—I

As previously indicated, in one exemplary embodiment, the Turbo Mode is achieved by temporarily increasing the power supply value, causing the circuitry to "speed up" (i.e., exhibit faster speeds of operation). Thus, if the power supply of the disclosed circuit were to be increased over that used during calibration, then the frequency of oscillation would increase with respect to the frequency exhibited with the original power supply value. When the system desires to return to a normal operating mode, the power supply is reduced back to the original value.

Assume that as part of a Turbo Mode capability, the circuit 100 performs its calibration sequence 200 and initiates the ring oscillator mode of operation 300. The System Clock output of the ring oscillator 100 now exhibits the approximate frequency of the original System Clock. As described above, one aspect of Turbo Mode operation could be a temporary increase in the power supply value. It is well known that this causes most circuitry to "speed up," i.e., exhibit faster speeds of operation.

If the power supply of the circuit 100 during operation 200 were to be increased over that used during calibration 200, then the frequency of oscillation would increase with respect to that exhibited with the original power supply value. This frequency increase could be used to obtain the higher speed clock of the Turbo Mode.

The clock frequency increase tracks the timing changes of the IC circuitry since both were due to an increase in power supply voltage. This would ensure that timing would still be met in turbo mode. To exit the Turbo Mode, the circuit 100 reduces the power supply back to the original value.

Turbo Mode Application—II

In a further variation, the Turbo Mode can be achieved by temporarily reducing the number of delay elements 140 that are operable in the ring oscillator loop, relative to the number of delay elements 140 that were operable in the ring oscillator loop during calibration.

Assume that for a Turbo Mode capability, it was either desired to operate at the original power supply value or it was desired to have a System Clock with a frequency that is greater than that obtained by merely increasing the power supply value. In either case, if the identity of the "thermometer register" transition DLE 140-i were changed to include fewer DLEs 140-left in the ring oscillator loop, the frequency would increase. Using the calibration sequence example, if instead of $B_2$ being the only $B_X$ value equal to 1, $B_2$ equals 0 and now $B_1$ equals 1 (the only nonzero $B_X$), then the output frequency of the circuit 100 increases.

Downshift Mode Application—I

As previously indicated, in one exemplary embodiment, the Downshift Mode is achieved by temporarily decreasing the power supply value, causing the circuitry to "slow down" (i.e., exhibit slower speeds of operation). Thus, if the power supply of the disclosed circuit were to be decreased relative to that used during calibration, then the frequency of oscillation would decrease with respect to the frequency exhibited with the original power supply value. When the system desires to return to a normal operating mode, the power supply is increased back to the original value.

Assume that as part of a Downshift Mode capability, the circuit 100 performs its calibration sequence 200 and initiates the ring oscillator mode of operation 300. The System Clock output of this ring oscillator 100 now exhibits the approximate frequency of the original System Clock. One aspect of a Downshift Mode operation could be a temporary decrease in power supply value. It is well known that this causes most circuitry to "slow down," i.e., exhibit slower speeds of operation.

If the power supply of the circuit 100 were to be decreased under that used during calibration 200, then the frequency of oscillation would decrease with respect to that exhibited with the original power supply value. This frequency decrease could be used to obtain the lower speed clock of the Downshift Mode.

The clock frequency decrease tracks the timing changes of the IC circuitry since both were due to a decrease in power supply voltage. This would ensure that timing would still be met in Downshift Mode. To exit the Downshift Mode, the circuit 100 increases the power supply back to the original value.

Downshift Mode Application—II

In a further variation, the Downshift Mode can be achieved by temporarily increasing the number of delay elements that are operable in the ring oscillator loop, relative to the number of delay elements that were operable in the ring oscillator loop during calibration.

Assume that for a Downshift Mode capability it was either desired to operate at the original power supply value or it was desired to have a System Clock with a frequency that is less than that obtained by merely decreasing the power supply value. In either case, if the identity of the "thermometer register" transition DLE 140-$i$ were changed to include more DLEs 140-left in the ring oscillator loop, the frequency would decrease.

Using the calibration sequence example, if instead of $B_2$ being the only $B_X$ value equal to 1, $B_2$ equals 0 and now $B_3$ equals 1 (the only nonzero $B_X$), then the output frequency of the circuit 100 decreases.

Performance Monitor

Since the present invention produces a "measurement" of the period of a ring oscillator that depends on process, voltage, and temperature (PVT), it can be used as a performance monitor in applications that require such circuitry.

CONCLUSION

It is noted that the frequency increase in the Turbo Mode is typically limited by the "met timing" limit of the underlying circuitry for operation at a certain maximum frequency. It is noted, however, that techniques may be implemented to increase the maximum frequency of the underlying circuitry.

In one embodiment, the system clock should be capable of changing back to its base frequency relatively quickly when the need for Turbo Mode or Downshift Mode has passed. It is noted that the Downshift Mode differs from a Sleep Mode in that the latter often accomplishes a profound reduction in IC activity and power whereas the former is meant to provide an incremental change in that direction.

In one or more exemplary embodiments described herein, a return from either a turbo or downshift mode is accomplished by returning the power supply to its original value. It is noted that in a further variation, a return from either a turbo or downshift mode is accomplished by configuring the multiplexer 185 to select the Original SYSCLK. It is further noted that this technique works in returning from a turbo mode because the clock slows down. Even if the power supply takes a long time to drop back to the original value, the circuitry will be able to "support" a slower (i.e., original) clock until the power supply is restored to the original value. There is a possible problem in returning from a downshift mode in this manner. If the original SYSCLK is selected, this is a faster clock than used in downshift mode. If the power supply has not yet increased sufficiently to "support" this faster (i.e., original) clock, there could be timing errors.

While FIGS. 2 and 3 show an exemplary sequence of steps, it is also an embodiment of the present invention that the sequence may be varied. Various permutations of the algorithms are contemplated as alternate embodiments of the invention.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for generating an offset clock having a frequency that is offset from a system clock, comprising:
   configuring a ring oscillator in a first mode to generate said system clock having a desired frequency by applying a predefined logic value to said ring oscillator for at least two rising edges of a gated version of said system clock; and
   adjusting said configuration of said ring oscillator in a second mode to generate said offset clock having said frequency that is offset from said system clock.

2. The method of claim 1, further comprising the step of identifying a number of delay line elements in said ring oscillator having an output that is a first predefined logic value.

3. The method of claim 2, wherein said number of delay line elements having said output that is said first predefined logic value is identified by applying an output of said delay line elements to one or more XOR gates.

4. The method of claim 2, wherein said number of delay line elements having said output that is said first predefined logic value provides an indication of a half period of said system clock.

5. The method of claim 2, wherein a final one of said delay line elements having said output that is said first predefined logic value provides an output of said ring oscillator.

6. The method of claim 1, wherein said adjusting step further comprises the step of adjusting a power supply value applied to said ring oscillator in said second mode relative to a power supply value applied in said first mode.

7. The method of claim 1, wherein said adjusting step further comprises the step of adjusting a number of delay line elements in said ring oscillator having an output that is a first predefined logic value in said second mode relative to a number of delay line elements in said ring oscillator having said output that is said first predefined logic value in said first mode.

8. A ring oscillator for generating an offset clock having a frequency that is offset from a system clock, comprising:
   a chain of delay line elements connected in series;
   a plurality of buffers, wherein each of said buffers is connected to an output of a corresponding one of said delay line elements, wherein a selected buffer provides an output of said corresponding delay line element as said system clock in a first mode having a first configuration; and
   means for adjusting said first configuration of said ring oscillator in a second mode to generate said offset clock having said frequency that is offset from said system clock.

9. The ring oscillator of claim 8, wherein a predefined logic value is applied to said ring oscillator for at least two rising edges of a gated version of said system clock.

10. The ring oscillator of claim 8, further comprising one or more XOR gates for processing an output of said delay line elements to identify said delay line elements having an output that is a first predefined logic value.

11. The ring oscillator of claim 8, wherein a number of said delay line elements having an output that is a first predefined logic value provides an indication of a half period of said system clock.

12. The ring oscillator of claim 8, wherein a final one of said delay line elements having an output that is a first predefined logic value provides an output of said ring oscillator.

13. The ring oscillator of claim 8, wherein said means for adjusting adjusts a power supply value applied to said ring oscillator in said second mode relative to a power supply value applied in said first mode.

14. The ring oscillator of claim 8, wherein said means for adjusting adjusts a number of delay line elements in said ring oscillator having an output that is a first predefined logic value in said second mode relative to a number of delay line elements in said ring oscillator having said output that is said first predefined logic value in said first mode.

15. An integrated circuit, comprising:
   a ring oscillator for generating an offset clock having a frequency that is offset from a system clock, comprising:
   a chain of delay line elements connected in series;
   a plurality of buffers, wherein each of said buffers is connected to an output of a corresponding one of said delay line elements, wherein a selected buffer provides an output of said corresponding delay line element as said system clock in a first mode having a first configuration; and
   means for adjusting said first configuration of said ring oscillator in a second mode to generate said offset clock having said frequency that is offset from said system clock.

16. The integrated circuit of claim 15, further comprising one or more XOR gates for processing an output of said delay line elements to identify said delay line elements having an output that is a first predefined logic value.

17. The integrated circuit of claim 15, wherein a final one of said delay line elements having an output that is a first predefined logic value provides an output of said ring oscillator.

18. The integrated circuit of claim 15, wherein said means for adjusting adjusts a power supply value applied to said ring oscillator in said second mode relative to a power supply value applied in said first mode.

19. The integrated circuit of claim 15, wherein said means for adjusting adjusts a number of delay line elements in said ring oscillator having an output that is a first predefined logic value in said second mode relative to a number of delay line elements in said ring oscillator having said output that is said first predefined logic value in said first mode.

* * * * *